(12) United States Patent
Onodera

(10) Patent No.: US 9,072,208 B2
(45) Date of Patent: Jun. 30, 2015

(54) MULTI-LAYER WIRING BOARD AND METHOD OF MANUFACTURING THE SAME

(71) Applicant: FUJIKURA LTD., Tokyo (JP)

(72) Inventor: Kumi Onodera, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/100,193

(22) Filed: Dec. 9, 2013

(65) Prior Publication Data

US 2014/0158408 A1 Jun. 12, 2014

(30) Foreign Application Priority Data

Dec. 10, 2012 (JP) ................................ 2012-269766

(51) Int. Cl.
*H05K 3/46* (2006.01)

(52) U.S. Cl.
CPC ......... *H05K 3/4617* (2013.01); *Y10T 29/49126* (2015.01); *H05K 3/4635* (2013.01)

(58) Field of Classification Search
CPC .......... H05K 2201/10287; H05K 7/06; H05K 3/103; H05K 3/386; H01L 2924/3011
USPC ........................................................ 174/251
See application file for complete search history.

(56) References Cited

U.S. PATENT DOCUMENTS

| 2003/0056978 A1* | 3/2003 | Terunuma et al. ............. 174/254 |
| 2009/0084583 A1* | 4/2009 | Ueno ............................. 174/254 |
| 2009/0217522 A1* | 9/2009 | Ito et al. .......................... 29/852 |

FOREIGN PATENT DOCUMENTS

JP 07-058425 A 3/1995

* cited by examiner

*Primary Examiner* — Jenny L Wagner
*Assistant Examiner* — Michael P McFadden
(74) *Attorney, Agent, or Firm* — Westerman, Hattori, Daniels & Adrian, LLP

(57) ABSTRACT

A multi-layer wiring board comprises: a plurality of multi-layer wiring units each having a plurality of printed wiring boards stacked therein via an adhesive layer, the printed wiring board having a wiring layer formed on an insulating base therein and having flexibility, and the wiring layers being connected to each other via a via that penetrates in a stacking direction; and a cable unit connecting between the plurality of multi-layer wiring units and having flexibility, the cable unit configured having a lower insulating base, the wiring layer formed on the lower insulating base and an upper insulating base disposed above the lower insulating base via the adhesive layer, the lower insulating base and the wiring layer correspond to one-layer of the printed wiring board, and the lower and upper insulating bases and the wiring layer being led out from the multi-layer wiring units.

8 Claims, 6 Drawing Sheets

MULTI-LAYER WIRING BOARD AND METHOD OF MANUFACTURING THE SAME

CROSS-REFERENCE TO RELATED APPLICATIONS

This application is based upon and claims the benefit of priority from the prior Japanese Patent Application No. 2012-269766, filed on Dec. 10, 2012, the entire contents of which are incorporated herein by reference.

BACKGROUND OF THE INVENTION

1. Field of the Invention

This invention relates to a multi-layer wiring board and a method of manufacturing the same.

2. Description of the Prior Art

In recent years, multi-layer wiring boards having stacked therein insulating bases in which wiring layers are formed are being frequently used as miniaturization of electronic devices proceeds. Known among such multi-layer wiring boards is a multi-layer wiring board that, in order to meet requirements of further miniaturization, and so on has a configuration combining a multi-layer wiring unit and a cable unit, the multi-layer wiring unit being a multi-layer wiring part with a multi-layer structure and having a wiring layer on which an electronic component is mounted exposed in a surface layer, and the cable unit being a cable part continuous from this multi-layer wiring unit and having flexibility (refer to, for example, Japanese Unexamined Patent Application Publication No. H7-58425 A).

However, in the multi-layer wiring board of conventional technology disclosed in the above-mentioned Japanese Unexamined Patent Application Publication No. H7-53425 A, an upper surface of the wiring layer of the cable unit is covered by a cover layer film that can be used as an adhesive layer of a rigid board. Therefore, the cover lay film includes a function as an adhesive agent, and there is a problem that handling during thermal compression bonding is difficult.

In addition, the multi-layer wiring unit and the cable unit are configured by materials of different characteristics, hence there is a risk that it is easy for stress to be generated causing variation in stretching properties or flexibility of the board, for distortion to occur at a boundary place of these portions, and furthermore for inter-layer peeling to occur due to a difference in coefficient of thermal expansion, and so on, whereby reliability falls.

SUMMARY OF THE INVENTION

This invention has an object of overcoming the above-mentioned problems of distortion or peeling due to the conventional technology to provide a multi-layer wiring board that can have high reliability and that can be manufactured by a simple process and that can be easily multi-layer wiring board.

A multi-layer wiring board according to an embodiment of the present invention comprises: a plurality of multi-layer wiring units each having a plurality of printed wiring boards stacked therein via an adhesive layer, the printed wiring board having a wiring layer formed on an insulating base therein and having flexibility, and the wiring layers being connected to each other via a via that penetrates in a stacking direction; and a cable unit connecting between the plurality of multi-layer wiring units and having flexibility, the cable unit configured having a lower insulating base, the wiring layer formed on the lower insulating base and an upper insulating base disposed above the lower insulating base via the adhesive layer, the lower insulating base and the wiring layer correspond to one-layer of the printed wiring board, and the lower and upper insulating bases and the wiring layer being led out from the multi-layer wiring units.

In the multi-layer wiring board according to the embodiment of the present invention, the cable unit connecting between the multi-layer wiring units is led out in a state where the lower insulating base, the wiring layer, the adhesive layer, and the upper insulating base that are layers continuous from the multi-layer wiring unit and correspond to one-layer of the multi-layer wiring unit are stacked in that order, hence the multi-layer wiring unit and the cable unit can be formed by an identical material having the same thickness and characteristics. This allows adoption of a structure in which there is no variation in stretching properties or flexibility of the board and in which it is difficult for distortion to occur at a boundary place between the multi-layer wiring unit and the cable unit, hence makes it possible to achieve an improvement in reliability. Moreover, the cable unit adopts a structure in which an adhesive material is disposed between an upper and a lower insulating base, hence handling during thermal compression bonding is also easy.

In an embodiment of the multi-layer wiring board, the cable unit includes at least two layers of the printed wiring board led out from the plurality of multi-layer wiring units.

In another embodiment of the multi-layer wiring board, the cable unit has provided therein a space where the adhesive layer has been removed, the space being provided between those of the insulating bases adjacent in the stacking direction that do not have the wiring layer formed therebetween.

In yet another embodiment of the multi-layer wiring board, the via is configured from an IVH filled by a conductive paste.

A method of manufacturing a multi-layer wiring board according to an embodiment of the present invention, the multi-layer wiring board including: a plurality of multi-layer wiring units each having a plurality of printed wiring boards stacked therein via an adhesive layer, the printed wiring board having a wiring layer formed on an insulating base therein and having flexibility, and the wiring layers being connected to each other via a via that penetrates in a stacking direction; and a cable unit connecting between the plurality of multi-layer wiring units and having flexibility, comprises the steps: forming the plurality of printed wiring boards each having the wiring layer formed on the insulating base therein; forming the adhesive layer on an opposite side to the wiring layer of the insulating base of a certain printed wiring board of the plurality of printed wiring boards; forming the via in a certain place of the certain printed wiring board; and aligning the plurality of printed wiring boards and performing stacking and thermal compression bonding so as to form: the plurality of multi-layer wiring units each having the plurality of printed wiring boards stacked therein via the adhesive layer and in each of which the wiring layers are connected to each other via the via that penetrates in the stacking direction; and the cable unit configured having a lower insulating base, the wiring layer formed on the lower insulating base and an upper insulating base disposed above the lower insulating base via the adhesive layer, the lower insulating base and the wiring layer correspond to one-layer of the printed wiring board, and the lower and upper insulating bases and the wiring layer being led out from the multi-layer wiring units.

The method of manufacturing a multi-layer wiring board according to an embodiment of the present invention allows the multi-layer wiring board displaying the above-described working effects to be manufactured by a simple process.

DESCRIPTION OF THE PREFERRED EMBODIMENTS

A multi-layer wiring board and method of manufacturing the same according to embodiments of this invention will be described in detail below with reference to the accompanying drawings.

Figure 1:
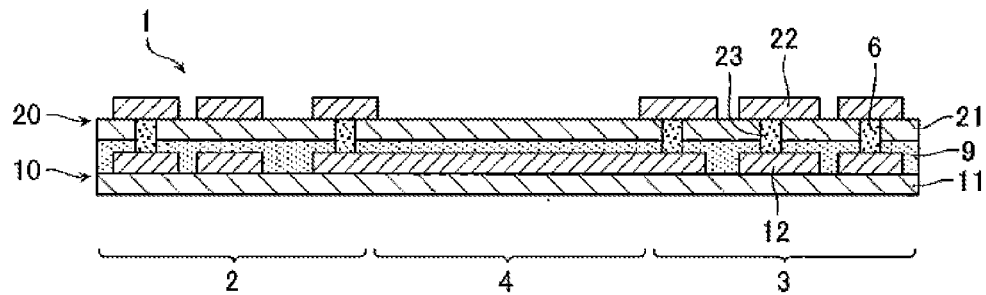
FIG. 1 is a cross-sectional view showing a structure of a multi-layer wiring board manufactured by a method of manufacturing of a multi-layer wiring board according to a first embodiment of the present invention.

FIG. 1 is a cross-sectional view showing a structure of a multi-layer wiring board formed by a method of manufacturing of a multi-layer wiring board according to a first embodiment of the present invention. As shown in FIG. 1, a multi-layer wiring board 1 comprises a structure in which a first printed wiring board 10 and a second printed wiring board 20 are stacked collectively by thermal compression, via an adhesive layer 9.

In addition, the multi-layer wiring board 1 includes: a plurality of multi-layer wiring units 2 and 3 of a multi-layer structure that are disposed at both ends of the multi-layer wiring board 1 and have a place where a wiring line 22 of the second printed wiring board 20 is exposed at a surface and have an electronic component mounted thereon; and a cable unit 4 led out from these plurality of multi-layer wiring units 2 and 3 in a direction of a surface of the first and second printed wiring boards 10 and 20 and connecting between each of the multi-layer wiring units 2 and 3. Note that in the present embodiment, the cable unit 4 is led out in a stacking unit corresponding to one-layer of the multi-layer wiring units 2 and 3. Now, the stacking unit refers to a state where a lower insulating base, a wiring layer, the adhesive layer, and an upper insulating base are stacked in that order.

The first printed wiring board 10 comprises: a first resin base 11 configured from an insulating base; and a wiring line 12 configured from a conductive material formed on one surface (a single side) of this first resin base 11. The second printed wiring board 20 comprises: a second resin base 21 configured from an insulating base; and the wiring line 22 configured from a conductive material formed on one side of this second resin base 21. The wiring line 22 is employed as a land for component mounting.

In addition, the second printed wiring board 20 comprises: the adhesive layer 9 configured from an adhesive material, or the like, attached to the other surface on an opposite side to a wiring line 22 side of the second resin base 21; and a via 23 for interlayer connection formed by filling with a conductive paste a via hole 6 that penetrates this adhesive layer 9 and the second resin base 21. The adhesive layer 9 is configured from, for example, a thermosetting resin of an epoxy system or an acrylic system, and so on.

The first and second resin bases 11 and 21 of the first and second printed wiring boards 10 and 20 are configured by a resin film having an insulating property. Employable as the resin film is a resin film configured from various kinds of insulating resins, for example, a resin film configured from the likes of a thermoplastic polyimide, polyolefin, or liquid crystal polymer (LOP), or a resin film configured from the likes of a thermosetting epoxy resin, and so on.

The wiring lines 12 and 22 are configured by pattern forming a conductive material such as, for example, copper foil. Each of the resin bases 11 and 21, or each of the wiring lines 12 and 22 are respectively formed having an identical thickness by an identical material. In the present embodiment, the first and second printed wiring boards 10 and 20 are each formed by a single-sided copper clad laminated board (single-sided CCL).

The via 23 is configured from a conductive paste via of an IVH structure, and in the present embodiment, a conductive paste of an Sn—Ag system is employed as the via 23. The conductive paste is configured from a paste member that includes, for example, at least one kind of metallic particle of low electrical resistance selected from the likes of nickel, gold, silver, copper, aluminum, and iron, and at least one kind of metallic particle of low melting point selected from the likes of tin, bismuth, indium, and lead, the paste member having mixed therein a binder component whose main component is an epoxy, an acrylic, a urethane, and so on.

The conductive, paste configured in this manner is configured to enable the metal of low melting point contained therein to melt and form an alloy at a temperature of 200° C. or less, specifically the likes of copper or silver comprise characteristics allowing an intermetallic compound to be formed. Therefore, a connection between the via 23 and the wiring lines 12 and 22 is joined by alloying by an intermetallic compound during collective stacking.

Note that the conductive paste may also be configured by a nanopaste in which, for example, a filler of the likes of gold, silver, copper, or nickel with a nanolevel particle diameter is mixed into a binder component of the above-described kind. In addition, the conductive paste may also be configured by a paste member having metallic particles of the above-described nickel, and so on, mixed into a binder component of the above-described kind.

In the case of employing such a paste member, the conductive paste is characterized in that electrical connection is performed by contact between fellow metallic particles. Note that various kinds of methods may be adopted as a method of filling the conductive paste into the via hole 6, for example, a printing method, a spin coating method, a spray coating method, a dispensing method, a laminating method, a method combining use of these methods, and so on.

Next, a method of manufacturing the multi-layer wiring board 1 according to the present embodiment will be described.

Figure 2:
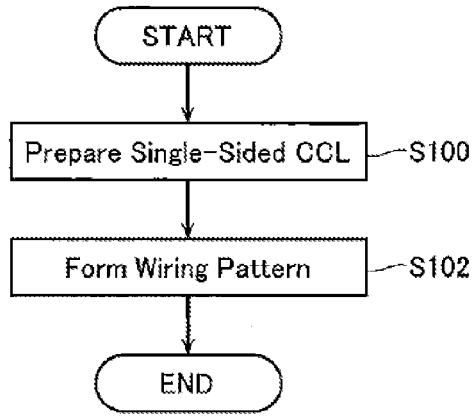
FIG. 2 is a flowchart showing a manufacturing process of same multi-layer wiring board.
Figure 3:
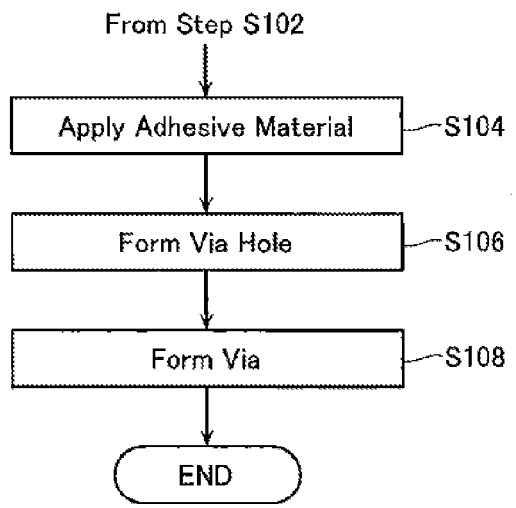
FIG. 3 is a flowchart showing a manufacturing process of same multi-layer wiring board.
Figure 4:
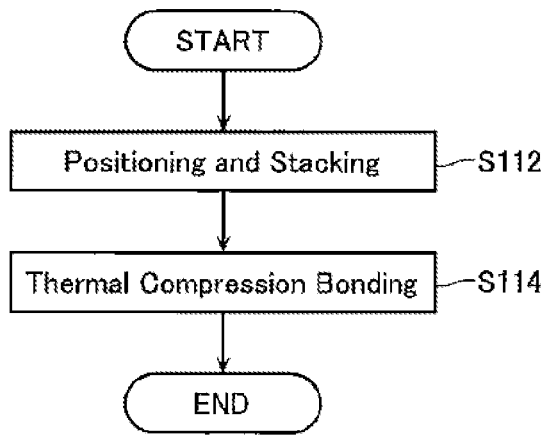
FIG. 4 is a flowchart showing a manufacturing process of same multi-layer wiring board.

FIGS. 2 to 4 are each a flowchart showing a manufacturing process of the multi-layer wiring board. Moreover, FIGS. 5A, 5B, 5A, 6B, 6C, 6D, and SE are each a cross-sectional view showing the multi-layer wiring board on a manufacturing process basis. First, a manufacturing process of the first printed wiring board 10 will be described with reference to FIG. 2 and FIGS. 5A and 5B.

Figure 5A:
FIG. 5A is a cross-sectional view showing same multi-layer wiring board on a manufacturing process basis.
Figure 5B:
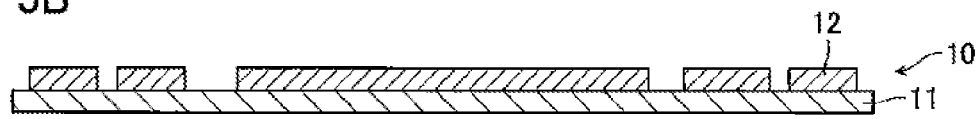
FIG. 5B is a cross-sectional view showing same multi-layer wiring board on a manufacturing process basis.

First, as shown in FIG. 5A, a single-sided CCL in which a conductor layer 8 configured from the likes of a solid-state copper foil is formed on one surface of the first resin base 11, is prepared (step S100). Then, for example, an etching resist is formed on the conductor layer 8 by photolithography, and then, as shown in FIG. 5B, etching is performed to form a wiring pattern of the wiring line 12 step S102). In this way, the first printed wiring board 10 is manufactured.

Employable, as the single-sided CCL employed in step S100 is, for example, the likes of a single-sided CCL of a structure in which the first resin base 11 having a thickness of about 25 μm is affixed to the conductor layer 8 configured from copper foil having a thickness of about 12 μm. Usable as the single-sided CCL is, for example, a single-sided CCL prepared by applying a varnish of polyimide to copper foil and hardening the varnish, by a publicly known casting method.

Otherwise employable, as the single-sided CCL are the likes of a single-sided CCL in which a seed layer is formed on a polyimide resin film by sputtering and the conductor layer 8 is formed by growing copper by plating, or a single-sided CCL prepared by attaching a rolled or electrolytic copper foil and a polyimide resin film by an adhesive material.

Note that the first resin base 11 (and the second resin base 21) are not necessarily required to be configured from a polyimide resin as described above, may be configured from a plastic film of a liquid crystal polymer, or the like. Moreover, an etchant whose main component is ferric chloride or cupric chloride may be employed in the etching in step S102.

Figure 6A:
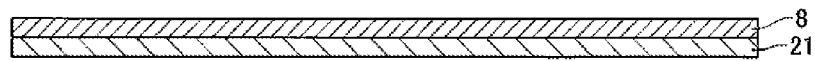
FIG. 6A is a cross-sectional view showing same multi-layer wiring board on a manufacturing process basis.
Figure 6B:
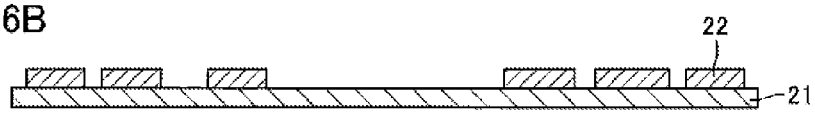
FIG. 6B is a cross-sectional view showing same multi-layer wiring board on a manufacturing process basis.
Figure 6C:
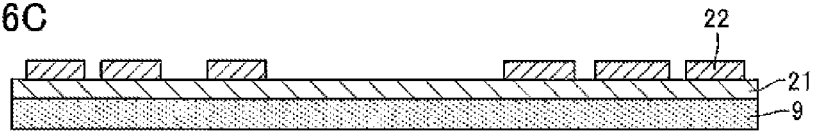
FIG. 6C is a cross-sectional view showing same multi-layer wiring board on a manufacturing process basis.

Next, a manufacturing process of the second printed wiring board 20 will be described with reference to FIG. 3 and FIGS. 6A to 6E. As shown in FIGS. 6A and 6B, a single-sided CCL having the conductor layer 8 formed on one surface of the second resin base 21 is prepared and a wiring pattern of the wiring line 22 is formed by etching or the like, similarly to in the above-described steps S100 and S102, then, as shown in FIG. 6C, the adhesive layer 9 is attached to a surface on an opposite side to a wiring line 22 formation surface side of the second resin base 21 by thermal compression bonding (step S104).

Employable as the adhesive layer 9 attached in step S104 is, for example, an epoxy system thermosetting resin film having a thickness of about 25 μm. The thermal compression bonding includes employing a vacuum laminator to press and attach these in a reduced pressure atmosphere, at a temperature where the adhesive layer 9 does not harden, by a pressure of 0.3 MPa.

Note that an interlayer adhesive material employed as the adhesive layer 9 includes not only an epoxy system thermosetting resin, but also the likes of an acrylic system adhesive material or a thermoplastic adhesive material typified by a thermoplastic polyimide, or the like. Moreover, the interlayer adhesive material is not necessarily required to be in a film state, and may have resin coated in a varnish state.

Figure 6D:
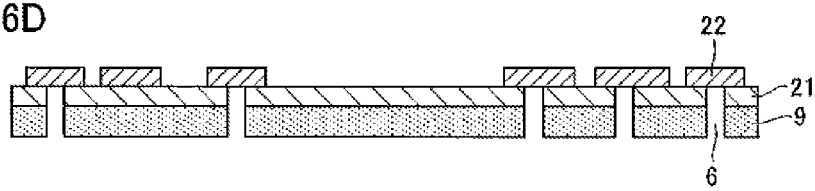
FIG. 6D is a cross-sectional view showing same multi-layer wiring board on a manufacturing process basis.

Next, as shown in FIG. 6D, a UV-YAG laser device, for example, is employed to irradiate laser light from an attached adhesive layer 9 side toward a desired wiring line 22, whereby the via hole 6 penetrating the adhesive layer 9 and the second resin base 21 is formed at a certain place (step S106). The formed via hole 6 undergoes, for example, desmear processing such as plasma desmear processing after its formation.

The via hole 6 formed in step S106 may otherwise by formed by the likes of a carbon dioxide laser ($CO_2$) laser) or an excimer laser, or may be formed by the likes of drill processing or chemical etching. Moreover, the desmear processing can be performed by a mixed gas of $CF_4$ and $O_2$ (tetrafluoromethane oxygen), but may also employ another inert gas such as Ar (argon), and may be configured as wet desmear processing employing a chemical, rather than so-called dry processing.

Figure 6E:
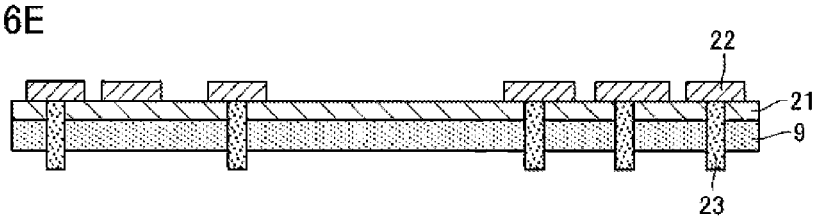
FIG. 6E is a cross-sectional view showing same multi-layer wiring board on a manufacturing process basis.

Then, as shown in FIG. 6E, the above-described conductive paste is filled into the formed via hole 6 by, for example, screen printing, or the like, to form the via 23 (step S108).

When the first and second printed wiring boards 10 and 20 have been manufactured in this way, then as shown in FIG. 4, each of the printed wiring boards 10 and 20 is positioned and stacked in a state where the adhesive layer 9 of the second printed wiring hoard 20 and the conductive paste of the via 23 are unhardened (step S112). Finally, for example, a vacuum press is employed to collectively stack by thermal compression bonding by applying heat and pressure in a reduced pressure atmosphere of 1 kPa or less (step S114), thereby manufacturing the multi-layer wiring board 1 of the kind shown in FIG. 1.

In this way, in the multi-layer wiring board 1 according to the first embodiment, the cable unit 4 connecting between each of the multi-layer wiring units 2 and 3 is led out in the stacking unit corresponding to one-layer of the multi-layer wiring units 2 and 3 in a layer continuous from the multi-layer wiring units 2 and 3, hence the multi-layer wiring board 1 according to the first embodiment allows the multi-layer wiring units 2 and 3 and the cable 4 to be formed by an identical material having the same thickness and characteristics.

This makes it possible to adopt a structure in which there is no variation in stretching properties or flexibility of the multi-layer wiring board 1 and in which it is difficult for distortion to occur at a boundary place between the multi-layer wiring units 2 and 3 and the cable unit 4. Moreover, there is no need for each of the units 2, 3, and 4 to be separately manufactured, and so on, then collectively stacked, hence reliability is high and it is possible for low profiling to be accomplished, thereby achieving miniaturization.

Figure 7:
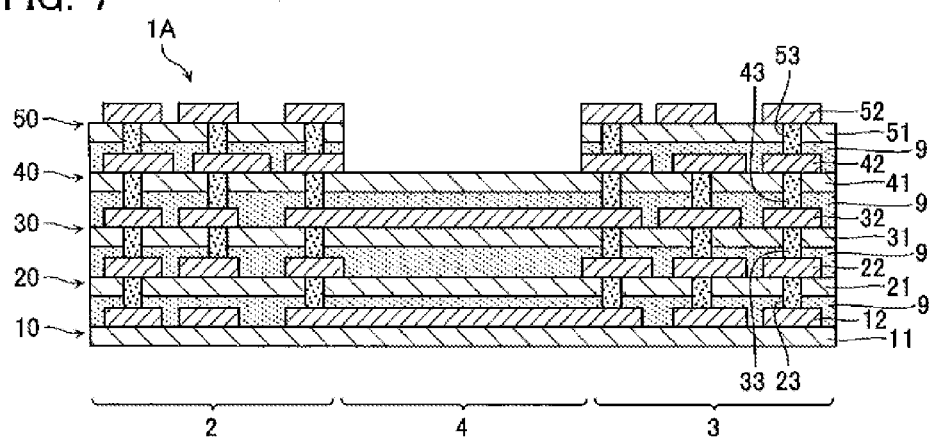
FIG. 7 is a cross-sectional view showing a structure of a multi-layer wiring board manufactured by a method of manufacturing of a multi-layer wiring board according to a second embodiment of the present invention.
Figure 8A:
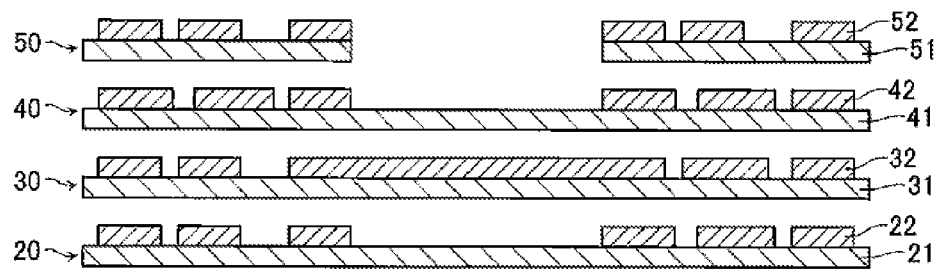
FIG. 8A is a cross-sectional view showing same multi-layer wiring board on a manufacturing process basis.
Figure 8B:
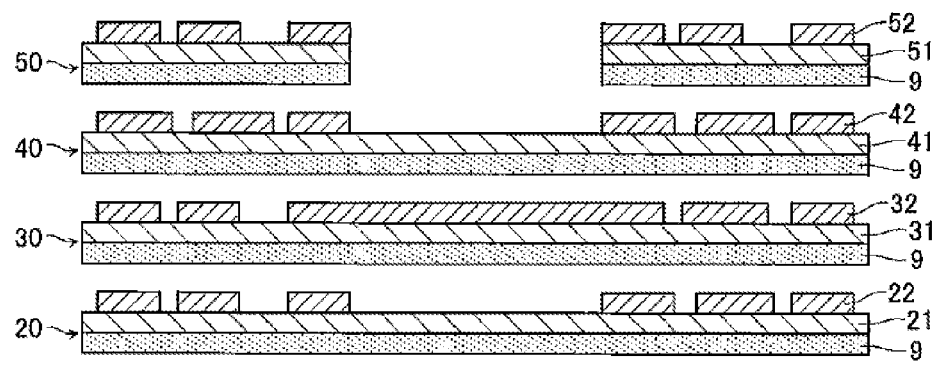
FIG. 8B is a cross-sectional view showing same multi-layer wiring board on a manufacturing process basis.
Figure 8C:
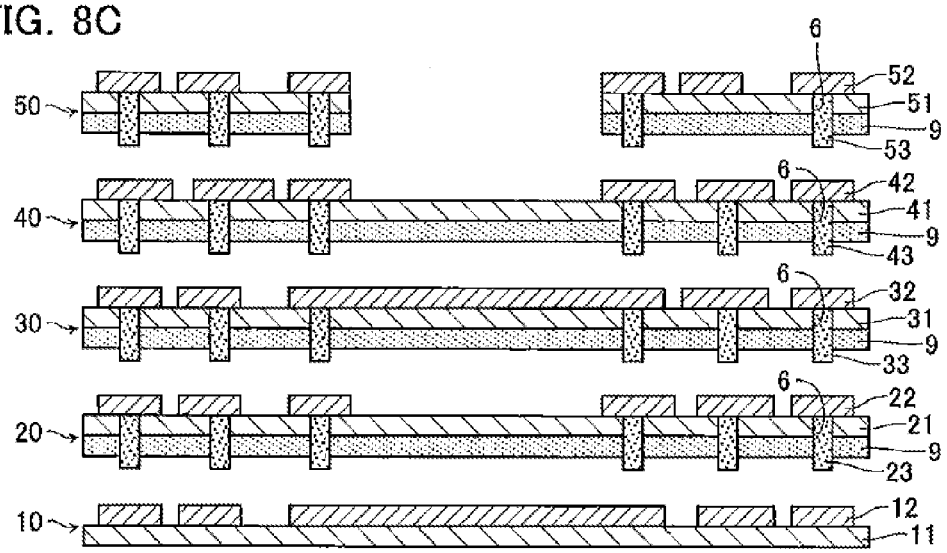
FIG. 8C is a cross-sectional view showing same multi-layer wiring board on a manufacturing process basis.

FIG. 7 is a cross-sectional view showing a structure of a multi-layer wiring board manufactured by a method of manufacturing of a multi-layer wiring board according to a second embodiment of the present invention. Moreover, FIGS. 8A, 8B, and 8C are each a cross-sectional view showing the multi-layer wiring board on a manufacturing process basis. As shown in FIG. 7, a multi-layer wiring board 1A according to the second embodiment is characterized by being configured from a multi-layer structure in which a third printed wiring board 30, a fourth printed wiring board 40, and a fifth printed wiring board 50 are further stacked on the first and second printed wiring boards 10 and 20 according to the first embodiment (FIG. 1).

The third through fifth printed wiring boards 30 to 50 respectively comprise pattern-formed wiring lines 32, 42, and 52 on one surface of a third resin base 31, a fourth resin base 41, and a fifth resin base 51. In addition, the third through fifth printed wiring boards 30 to 50 comprise vies 33, 43, and 53 for interlayer connection, at certain places. The wiring line 52 of the fifth printed wiring board 50 is employed as a land for component mounting. Moreover, the fifth printed wiring board 50 is provided only at places corresponding to each of the multi-layer wiring units 2 and 3 and is stacked in a state of not being present at a place corresponding to the cable unit 4. Each of the multi-layer wiring units 2 and 3 are configured in five-layers of multi-layer structure, and the cable unit 4 is led out in three-layers of multi-layer structure.

The multi-layer wiring board 1A configured in this way can be manufactured similarly to in the above-described manufacturing process. That is, as shown in FIG. 8A, the wiring lines 12 to 52 are pattern-formed on one surface of the first through fifth resin bases 11 to 51 of the first through fifth printed wiring boards 10 to 50 (first printed wiring board 10 not illustrated), then, as shown in FIG. 8E, the adhesive layer 9 is respectively attached to the other surface of the second through fifth resin bases 21 to 51.

Then, as shown in FIG. 8C, after forming the via hole 6 at a certain place, the conductive paste is filled into the via hole 5 to form the vies 73 to 53. Finally, if the first through fifth printed wiring boards 10 to 50 are positioned and collectively stacked by thermal compression bonding as described above, the multi-layer wiring board 1A of the kind shown in FIG. 7 can be manufactured.

The multi-layer wiring board 1A according to the second embodiment not only allows similar working effects to those of the multi-layer wiring board 1 according to the first embodiment to be displayed, but also, since: the cable unit 4 has a multi-layer structure, allows miniaturization to be achieved while accomplishing low profiling, even in a more complicated circuit configuration, and allows a multi-layer wiring board of high reliability to be achieved.

Figure 9:
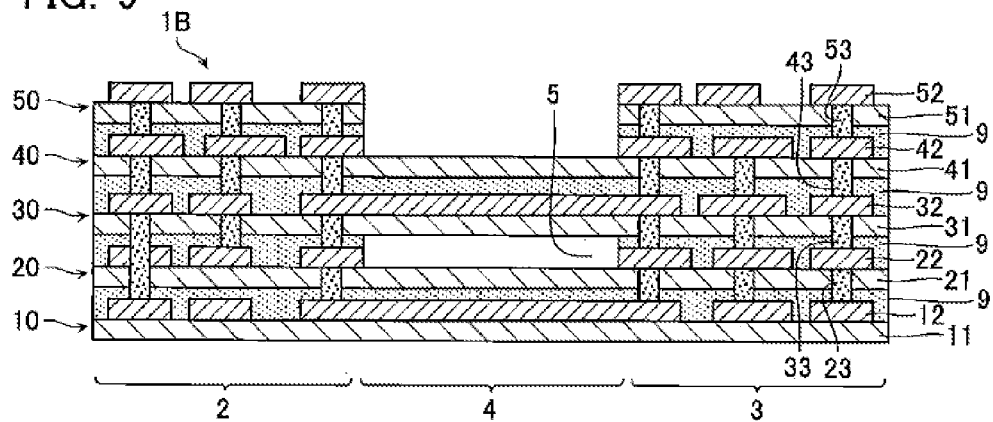
FIG. 9 is a cross-sectional view showing a structure of a multi-layer wiring board manufactured by a method of manufacturing of a multi-layer wiring board according to a third embodiment of the present invention.
Figure 10A:
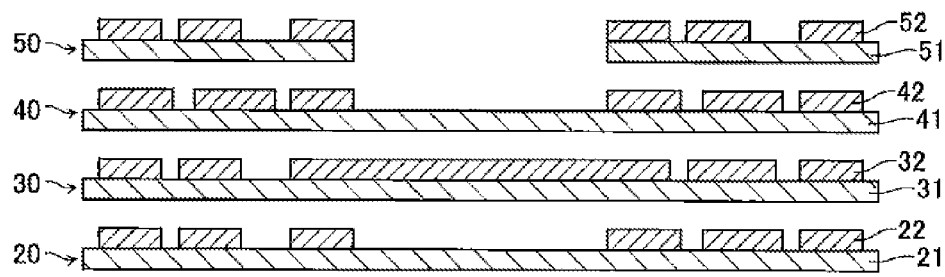
FIG. 10A is a cross-sectional view showing same multi-layer wiring board on a manufacturing process basis.
Figure 10B:
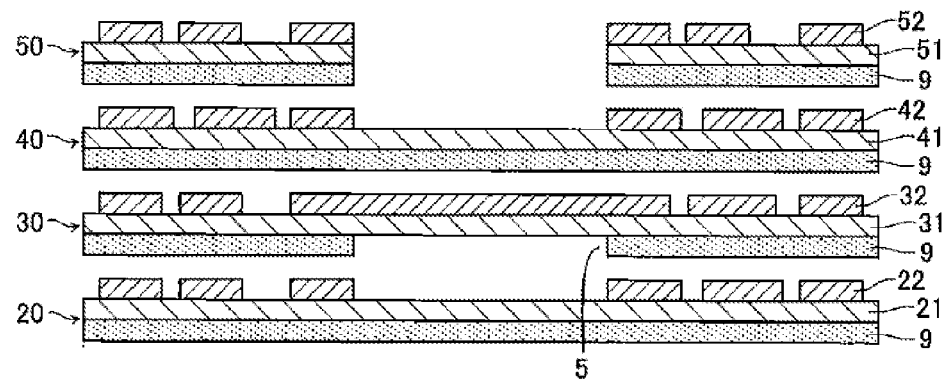
FIG. 10B is a cross-sectional view showing same multi-layer wiring board on a manufacturing process basis.
Figure 10C:
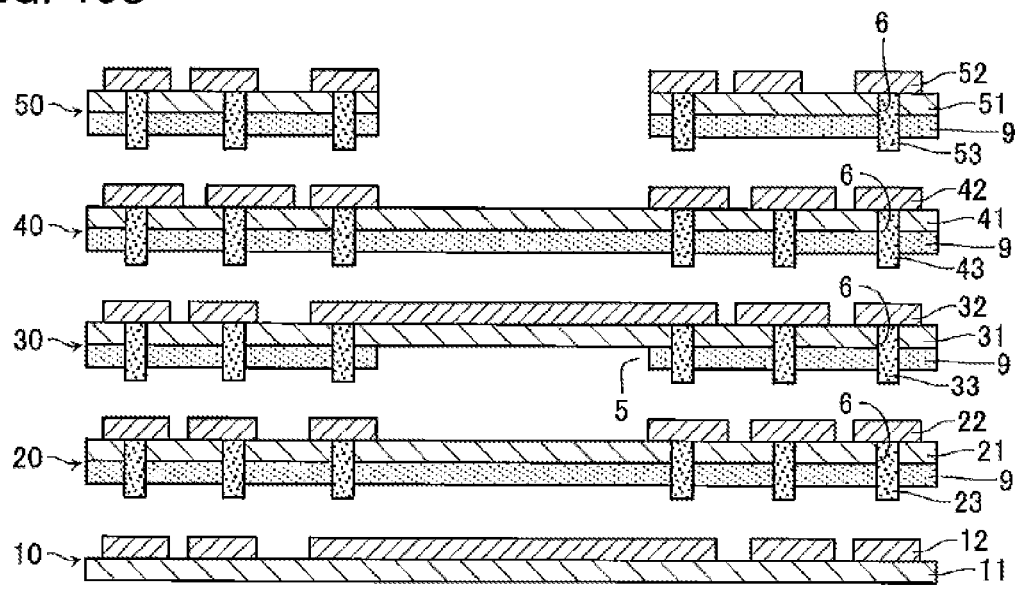
FIG. 10C is a cross-sectional view showing same multi-layer wiring board on a manufacturing process basis.

FIG. 9 is a cross-sectional view showing a structure of a multi-layer wiring board manufactured by a method of manufacturing of a multi-layer wiring board according to a third embodiment of the present invention. FIGS. 10A, 10B, and 10C are each a cross-sectional view showing the multi-layer wiring board on a manufacturing process basis. As shown in FIG. 9, a multi-layer wiring board 1B according to the third embodiment is similar to the multi-layer wiring board 1A according to the second embodiment in being comprised from a multi-layer structure having the first through fifth printed wiring boards 10 to 50 stacked, but has a different structure: of the cable unit 4.

That is, in the cable unit 4, the adhesive layer 9 is not present and a space 5 is thereby formed, between each of the resin bases 21 and 31 of the second printed wiring board 20 and the third printed wiring board 30. As a result, a thickness of the cable unit 4 is the same three-layers as in the multi-layer wiring board 1A according to the second embodiment. However, since one-layer of the adhesive layer 9 is not present, it is possible to configure a cable unit 4 that further excels in flexibility (bendability).

The multi-layer wiring board 1B configured in this way can be manufactured similarly to in the above-described manufacturing process. That is, as shown in FIG. 10A, the wiring lines 12 to 52 are pattern-formed on one surface of the first through fifth resin bases 11 to 51 of the first through fifth printed wiring boards 10 to 50 (first printed wiring board 10 not illustrated), then, as shown in FIG. 10B, the adhesive layer 9 is respectively attached to the other surface of the second through fifth resin bases 21 to 51 in a state that excludes a place which is to become the cable unit 4 in the other surface of the third resin base 31.

Then, as shown in FIG. 10C, if the conductive paste is filled into the via hole 6 formed at a certain place to form the vias 23 to 53, and the first through fifth printed wiring boards 10 to 50 are positioned then collectively stacked, the multi-layer wiring board 1B of the kind shown in FIG. 9 can be manufactured.

The multi-layer wiring board 1B according to the third embodiment not only allows similar working effects to those of the multi-layer wiring board 1A according to the second embodiment to be displayed, but also, since the cable unit 4 has a more highly flexible structure, allows achievement of a multi-layer wiring board that has high locational versatility of the multi-layer wiring board, achieves miniaturization while accomplishing low profiling, and has high reliability.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-layer wiring board, comprising: a plurality of multi-layer wiring units each having a plurality of printed wiring boards stacked therein via an adhesive layer, the printed wiring board having a wiring layer formed on an insulating base therein and having flexibility, and the wiring layers being connected to each other via a via that penetrates in a stacking direction; and a cable unit connecting between the plurality of multi-layer wiring units and having flexibility, the cable unit configured having a lower insulating base, the wiring layer formed on the lower insulating base and an upper insulating base disposed above the lower insulating base via the adhesive layer, the lower insulating base and the wiring layer correspond to one-layer of the printed wiring board, and the lower and upper insulating bases and the wiring layer being led out from the multi-layer wiring units, wherein the upper insulating base includes the wiring layer formed on an upper surface of the upper insulating base in the multi-layer wiring units; and wherein the cable unit has provided therein an empty space where the adhesive layer has been removed, the empty space being provided between those of the insulating bases adjacent in the stacking direction that do not have the wiring layer formed therebetween.

2. The multi-layer wiring board according to claim 1, wherein
the cable unit includes at least two layers of the printed wiring board led out from the plurality of multi-layer wiring units.

3. The multi-layer wiring board according to claim 1, wherein the via is configured from an IVH (Interstitial Via Hole) filled by a conductive paste.

4. A method of manufacturing a multi-layer wiring board, the multi-layer wiring board including: a plurality of multi-layer wiring units each having a plurality of printed wiring boards stacked therein via an adhesive layer, the printed wiring board having a wiring layer formed on an insulating base therein and having flexibility, and the wiring layers being connected to each other via a via that penetrates in a stacking direction; and a cable unit connecting between the plurality of multi-layer wiring units and having flexibility, the method comprising the steps of: forming the plurality of printed wiring boards each having the wiring layer formed on the insulating base therein; forming the adhesive layer on an opposite side to the wiring layer of the insulating base of a certain printed wiring board of the plurality of printed wiring boards; forming the via in a certain place of the certain printed wiring board; and aligning the plurality of printed wiring boards and performing stacking and thermal compression bonding so as to form: the plurality of multi-layer wiring units each having the plurality of printed wiring boards stacked therein via the adhesive layer and in each of which the wiring layers are connected to each other via the via that penetrates in the stacking direction; and the cable unit configured having a lower insulating base, the wiring layer formed on the lower insulating base and an upper insulating base disposed above the lower insulating base via the adhesive layer, the lower insulating base and the wiring layer correspond to one-layer of the printed wiring board, and the lower and upper insulating bases and the wiring layer being led out from the multi-layer wiring units, wherein the upper insulating base includes the wiring layer formed on an upper surface of the upper insulating base in the multi-layer wiring units; and wherein the cable unit includes therein an empty space where the adhesive layer has been removed, the empty space being provided between those of the insulating bases adjacent in the stacking direction that do not have the wiring layer formed therebetween.

5. The multi-layer wiring board according to claim 1, wherein
the lower insulating base and the upper insulating base are each formed by identical material.

6. The multi-layer wiring board according to claim 1, wherein
the lower insulating base and the upper insulating base each have identical thickness.

7. The method according to claim 4, wherein
the lower insulating base and the upper insulating base are each formed by identical material.

8. The method according to claim 7, wherein
the lower insulating base and the upper insulating base each have identical thickness.

* * * * *